(12) United States Patent
Roelver et al.

(10) Patent No.: US 11,402,210 B2
(45) Date of Patent: Aug. 2, 2022

(54) METHOD FOR ASCERTAINING THE CHANGE IN A SPATIAL ORIENTATION OF AN NMR GYROSCOPE AND AN NMR GYROSCOPE

(71) Applicant: Robert Bosch GmbH, Stuttgart (DE)

(72) Inventors: Robert Roelver, Calw-Stammheim (DE); Andreas Brenneis, Renningen (DE); Felix Michael Stuerner, Illerkirchberg (DE); Janine Riedrich-Moeller, Leonberg-Warmbronn (DE); Tino Fuchs, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 39 days.

(21) Appl. No.: 17/111,172

(22) Filed: Dec. 3, 2020

(65) Prior Publication Data

US 2021/0172739 A1 Jun. 10, 2021

(30) Foreign Application Priority Data

Dec. 6, 2019 (DE) ...................... 10 2019 219 052.9

(51) Int. Cl.
*G01C 19/62* (2006.01)
*G01R 33/46* (2006.01)
*G01C 19/04* (2006.01)

(52) U.S. Cl.
CPC ............. *G01C 19/62* (2013.01); *G01C 19/04* (2013.01); *G01R 33/46* (2013.01)

(58) Field of Classification Search
CPC ......... G01C 19/62; G01C 19/04; G01R 33/46
See application file for complete search history.

(56) References Cited

U.S. PATENT DOCUMENTS

| 4,509,014 A | 4/1985 | Karwacki et al. |
| 2014/0327439 A1 | 11/2014 | Cappellaro et al. |

(Continued)

FOREIGN PATENT DOCUMENTS

| CN | 103557855 A | 2/2014 |
| CN | 103743390 A | 4/2014 |

(Continued)

OTHER PUBLICATIONS

Ajoy, A. et al., "Stable three-axis nuclear-spin gyroscope in diamond," Physical Review A, 2012, vol. 86, 062104 (7 pages).

*Primary Examiner* — Dixomara Vargas
(74) *Attorney, Agent, or Firm* — Maginot, Moore & Beck LLP

(57) ABSTRACT

A method for ascertaining a change in a spatial orientation of a nuclear magnetic resonance (NMR) gyroscope having a diamond doped with color centers includes applying a static external magnetic field in a first direction, polarizing a nuclear spin of the color centers of the diamond in a direction of the static magnetic field, and generating a cophasal Larmor precession of the nuclear spin of the color centers of the diamond through application of an alternating magnetic field in a second direction perpendicular to the first direction, whose frequency corresponds to the Larmor frequency of the nuclear spin of the color centers. The method further includes measuring a phase of the Larmor precession, and ascertaining a change in the spatial orientation in a plane perpendicular to the first direction based on a deviation of the precession frequency from an expected value.

10 Claims, 5 Drawing Sheets

(56) References Cited

U.S. PATENT DOCUMENTS

| | | | |
|---|---|---|---|
| 2015/0090033 A1 | 4/2015 | Budker et al. | |
| 2020/0057117 A1* | 2/2020 | Nishibayashi | G01R 33/032 |
| 2020/0300945 A1* | 9/2020 | Roy-Guay | G01R 33/0206 |

FOREIGN PATENT DOCUMENTS

| | | |
|---|---|---|
| CN | 105403210 A | 3/2016 |
| EP | 3 546 886 A1 | 10/2019 |
| WO | 2018/097764 A1 | 5/2018 |

\* cited by examiner

METHOD FOR ASCERTAINING THE CHANGE IN A SPATIAL ORIENTATION OF AN NMR GYROSCOPE AND AN NMR GYROSCOPE

This application claims priority under 35 U.S.C. § 119 to patent application no. DE 10 2019 219 052.9, filed on Dec. 6, 2019 in Germany, the disclosure of which is incorporated herein by reference in its entirety.

The disclosure relates to a method for ascertaining the change in a spatial orientation of an NMR gyroscope and an NMR gyroscope.

BACKGROUND

Rotation rate sensors or gyroscopes based on MEMS can be used to ascertain a change in a spatial orientation. These are small and economical, the drift amounts to about 1°/hour, and their accuracy allows, for example, self-driving automobiles to maintain their track for about 40 seconds if all other driver assistance systems fail. They can, for example, be used as backup for radar positioning, video assistance positioning and GPS positioning.

Laser gyroscopes that can be used for aircraft navigation are significantly more accurate. They are based on the optical Sagnac effect, and their drift amounts to only about 0.0035°/hour. They are, however, relatively large and expensive, and are therefore scarcely suitable for use in vehicles.

An alternative possibility is that of using NMR (nuclear magnetic resonance, or nuclear spin resonance) gyroscopes. These evaluate nuclear spin resonance signals from atomic nuclei with non-vanishing magnetic moments. These can be manufactured in miniature form and exhibit a drift of about 0.02°/hour. They are therefore up to 50 times more accurate than MEMS gyroscopes.

Various proposals for evaluating nuclear spin precession at color centers of a diamond are known. Such concepts are disclosed, for example, in US 2015/090033A, in CN 103 743390 A, in WO 18097764 A1, in CN 105 403210 A and in CN 103 557855 A. These systems are, however, capable of improvement.

SUMMARY

A method for ascertaining the changes in spatial orientation of an NMR gyroscope, and an NMR gyroscope with the features disclosed herein are proposed. Advantageous embodiments are objects of the following description.

The disclosure makes use of the measure of generating, after the polarization of the nuclear spin of the color centers of diamonds, a cophasal Larmor precession through the application of an alternating magnetic field, whose frequency corresponds to the Larmor frequency of the nuclear spin of these color centers, in a direction perpendicular to a static magnetic field. In this way it is possible to omit a deliberate rotation of the diamond as well as complicated evaluation methods such as those of the prior art, and for a change in the orientation in a plane perpendicular to the static magnetic field to be ascertained significantly more accurately by measuring a phase of the Larmor precession.

In particular here the measurement is made by irradiating the diamond with a microwave pulse and an excitation light beam to trigger fluorescence of the color centers, and measurement of an intensity of the fluorescent light. The phase can be ascertained very accurately in this way.

In a particularly preferred form of embodiment, the alternating magnetic field is adjusted in a second direction perpendicular to the first direction of the static magnetic field in the presence of a deviation of the precession frequency from the expected value by means of a phase-locked loop corresponding to a phase shift between the measured precession frequency and the applied alternating magnetic field, so that the alternating magnetic field and the Larmor precession are again cophasal. This is particularly advantageous, since in this way the precession of the nuclear spin of the different color centers remains cophasal.

Preferably the change in orientation of the diamond, and thereby of the NMR gyroscope, is ascertained from the required adjustment of the applied alternating magnetic field by means of the relationship $\overline{\omega_k}=\gamma_k\overline{B}+\overline{\Omega}$, wherein $\overline{\omega_L}$ is the precession frequency of the nuclear spin, $\overline{B}$ is the static magnetic field in the first direction, $\gamma_k$ is the gyromagnetic ratio, and $\overline{\Omega}$ is the change in orientation in a plane perpendicular to the first direction. This is advantageous, since the necessary adjustment by the phase-locked loop can be determined very accurately, and in this way complicated evaluation methods are no longer necessary.

The NMR gyroscope is expediently screened from external interfering magnetic fields, preferably by a screen surrounding the NMR gyroscope, for example one or more layers of mu-metal. This is advantageous, since the accuracy of the NMR gyroscope is in this way good, largely regardless of interfering fields.

The polarization of the nuclear spin is preferably achieved through the following steps:

irradiating the diamond with a laser pulse, whose duration and intensity are selected such that all of the color centers lying within the irradiation region are optically excited, so that the color centers enter the ground state with magnetic quantum number ms=0 in which the electron spins are polarized, but the nuclear spins have two states, so that the hyperfine structure splitting is still maintained;

irradiating the diamond with a microwave pulse whose frequency is selected such that it can drive a resonant transition from the state with magnetic quantum number ms=0 to a hyperfine level with magnetic quantum number ms=−1 or MS=+1, wherein a length of the microwave pulse corresponds to half a Rabi time constant;

irradiating the diamond with an RF π-pulse, so that a transition between hyperfine levels with the same electron spin but different nuclear spin orientation is generated;

irradiating the diamond with laser light so that the electron states are optically excited and subsequently fall back to the lowest hyperfine structure level.

This is not to be understood restrictively. Nevertheless, having the electron states identical in all the color centers, and the nuclear spins polarized, is achieved very effectively in this way.

Further advantages and elaborations of the disclosure emerge from the description and the appended drawing.

The disclosure is illustrated schematically by way of an exemplary embodiment in the drawings and will be described below with reference to the drawing.

DETAILED DESCRIPTION

Figure 1:
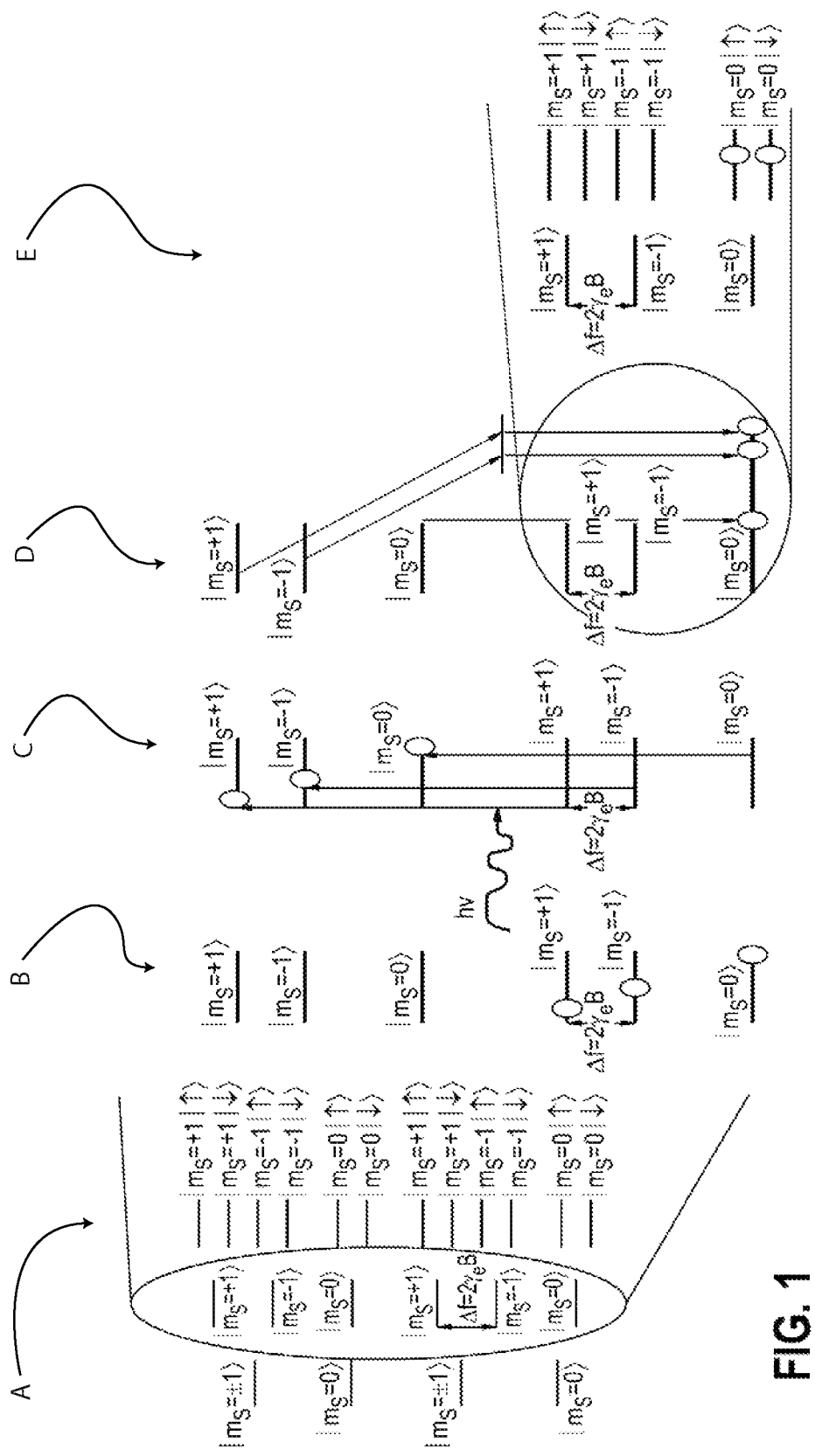
FIG. 1 shows, with reference to energy level diagrams of nitrogen vacancies of a diamond, steps for the polarization of the nuclear spin according to a preferred form of embodiment of a method according to the disclosure.

In section A, FIG. 1 shows an energy level diagram that comes into being through splitting valence electron states of nitrogen vacancies in the magnetic quantum number through an external static magnetic field $B_0$.

The physical properties of color centers such as nitrogen vacancy centers in a crystal body, in particular a diamond grid, also referred to as NV centers (nitrogen vacancy centers) can be utilized, for example, in the field of sensor technology. By exciting this kind of NV centers with visible light in the green region and microwave radiation, a fluorescence, depending on the magnetic field, can be observed. This fluorescence can be acquired by means of sensor equipment and evaluated. Silicon (SiV) may be mentioned as a further example of such color centers in diamond.

As a result, the energy levels with magnetic quantum number $ms=0$, $ms=+1$ and $ms=-1$ differ in the ground state and in the excited state. In addition, a hyperfine structure splitting with spin up and spin down arises as a result of electron-nuclear spin interaction.

Section B shows a simplified energy level diagram without the hyperfine structure splitting. For each magnetic quantum number, there are nitrogen vacancies in the ground state, in which the valence electron occupies this state.

The transition from section B to section C is triggered by a laser pulse. Its duration and intensity are selected such that all of the color centers lying within the irradiated region are optically excited once during the irradiation period. With a laser intensity of 1 W, and a beam diameter between 90 and 110 μm, preferably of 100 μm, the pulse duration is at least 10 ns. The electrons then fall back from the excited state to the energy level with the magnetic quantum number $ms=0$, so that all of the valence electron states of the nitrogen vacancies in the diamond are in this state, as is illustrated in section D. The hyperfine structure levels spin up and spin down here are equally occupied, as can be seen in section E.

Figure 2:
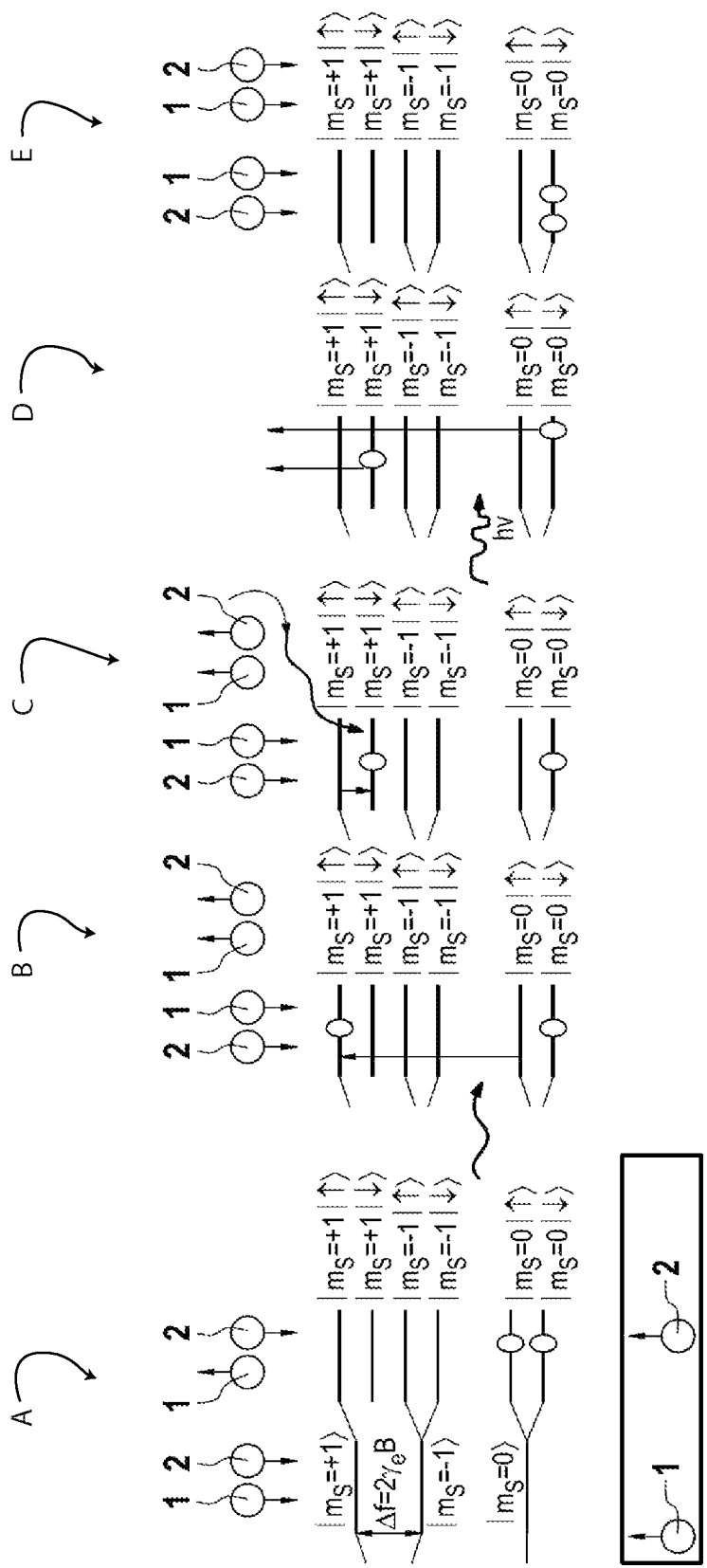
FIG. 2 shows, with reference to energy level diagrams of nitrogen vacancies of a diamond, further steps for the polarization of the nuclear spin according to a preferred form of embodiment of a method according to the disclosure.

In section A FIG. 2 shows the split energy levels in the ground state, as well as the two occupied hyperfine structure states with the magnetic quantum number $ms=0$. In the lower hyperfine structure state, the electron spin 1 and the nuclear spin 2 are aligned parallel to one another. In the upper hyperfine structure state the electron spin 1 and the nuclear spin 2 are aligned anti-parallel to one another.

From section A to section B the diamond is irradiated with a microwave pulse whose frequency is selected such that it can drive a resonant transition from the state with magnetic quantum number $ms=0$ into one of the hyperfine structure levels of the states with magnetic quantum number $ms=+1$ or $ms=-1$. Its duration, in other words the length of the pi-pulse, corresponds to half the Rabi time constant. Since only one of the hyperfine structure levels is occupied in a nitrogen vacancy site, and only the electron state is affected, the transition can only take place between hyperfine structure levels with the same nuclear spin orientation. In the next step from B to C a transition between hyperfine structure levels with the same electron spin but different nuclear spin orientation is generated through the injection of an RF π-pulse.

From C to D a selective occupancy of the respective corresponding hyperfine level is achieved through optical pumping with green laser light into the excited state. After this, the electrons fall back into the ground state.

At the end, all the electrons are in the lowest ground state, and the nuclear spins 2 are polarized.

One form of embodiment of the method according to the disclosure is carried out in that, as described above, a static, external magnetic field is applied in a first direction, and the nuclear spins of the color centers of the diamond are polarized in the direction of the static magnetic field.

Through an alternating magnetic field in a second direction perpendicular to the first direction, a cophasal Larmor precession of the nuclear spin is generated, which is applied in a second direction perpendicular to the first direction, whose frequency corresponds to the Larmor frequency of the nuclear spin of these color centers. This is advantageously created through a Helmholtz coil geometry and a frequency-modulated current generator.

How a phase of the Larmor precession is measured through irradiation of the crystal with a microwave pulse and an excitation light beam, in order to trigger a fluorescence of the color centers and measurement of an intensity of the fluorescent light, will now be described with reference to FIGS. 3 and 4.

Figure 3:
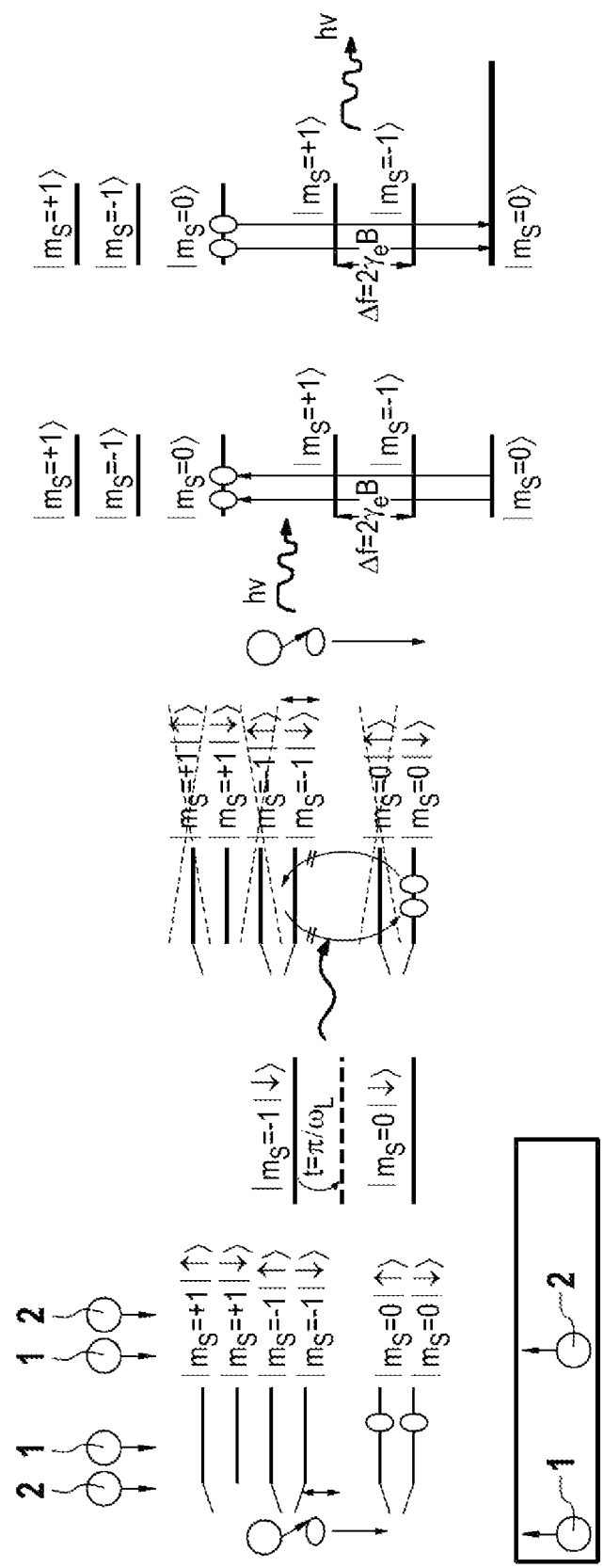
FIG. 3 shows, with reference to energy level diagrams of nitrogen vacancies of a diamond, steps for reading a phase of the Larmor precession according to a preferred form of embodiment of a method according to the disclosure.

If the microwave pulse strikes the hyperfine transition, which always occurs at a time $t=n2\pi/\omega_L$, where n is a counting factor and $\omega_L$ is the Larmor frequency, the fluorescence of the diamond is maximally attenuated, as can be seen in FIG. 3.

Figure 4:
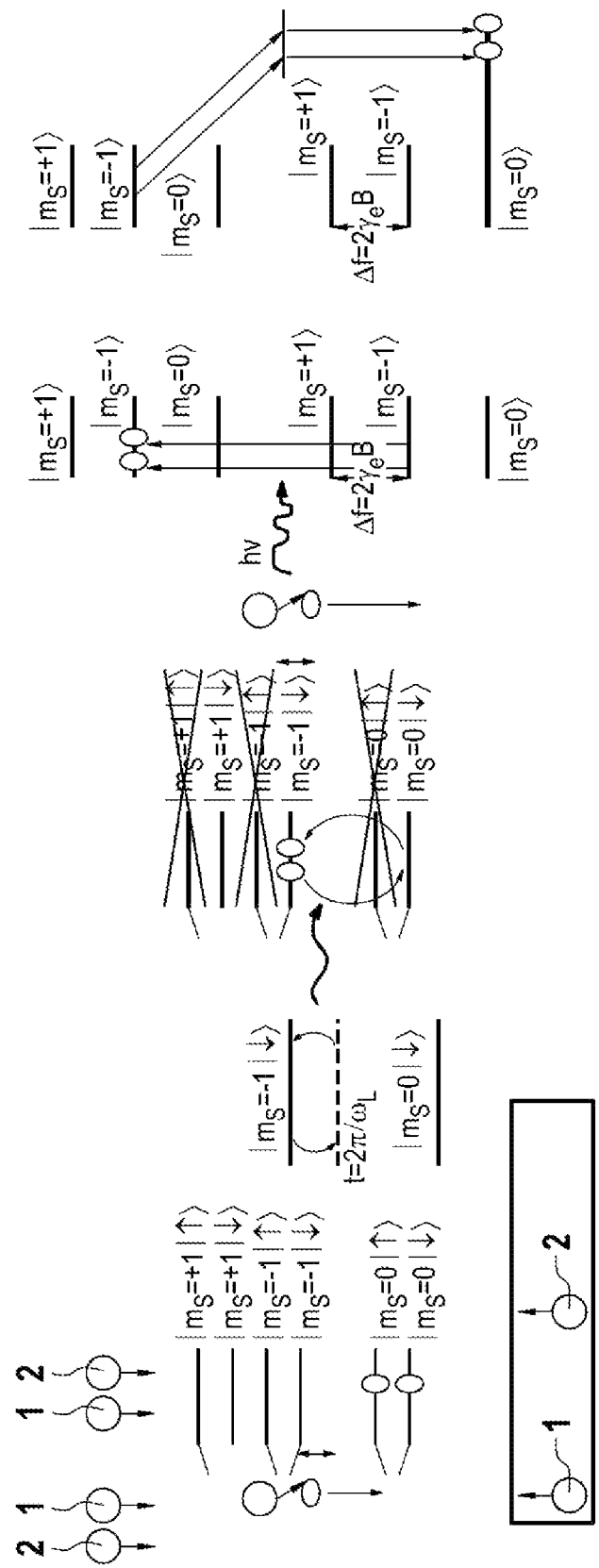
FIG. 4 shows, with reference to energy level diagrams of nitrogen vacancies of a diamond, steps for reading a phase of the Larmor precession according to a preferred form of embodiment of a method according to the disclosure.

If the frequency of the microwave pulse has the maximum distance from the resonant hyperfine structure transition, which always occurs at a time $t=n\pi/\omega_L$, the maximum fluorescence is observed, as is illustrated in FIG. 4.

After the determination of the phase, a change in the orientation in a plane perpendicular to the first direction is ascertained based on a deviation of the precession frequency from an expected value.

Figure 5:
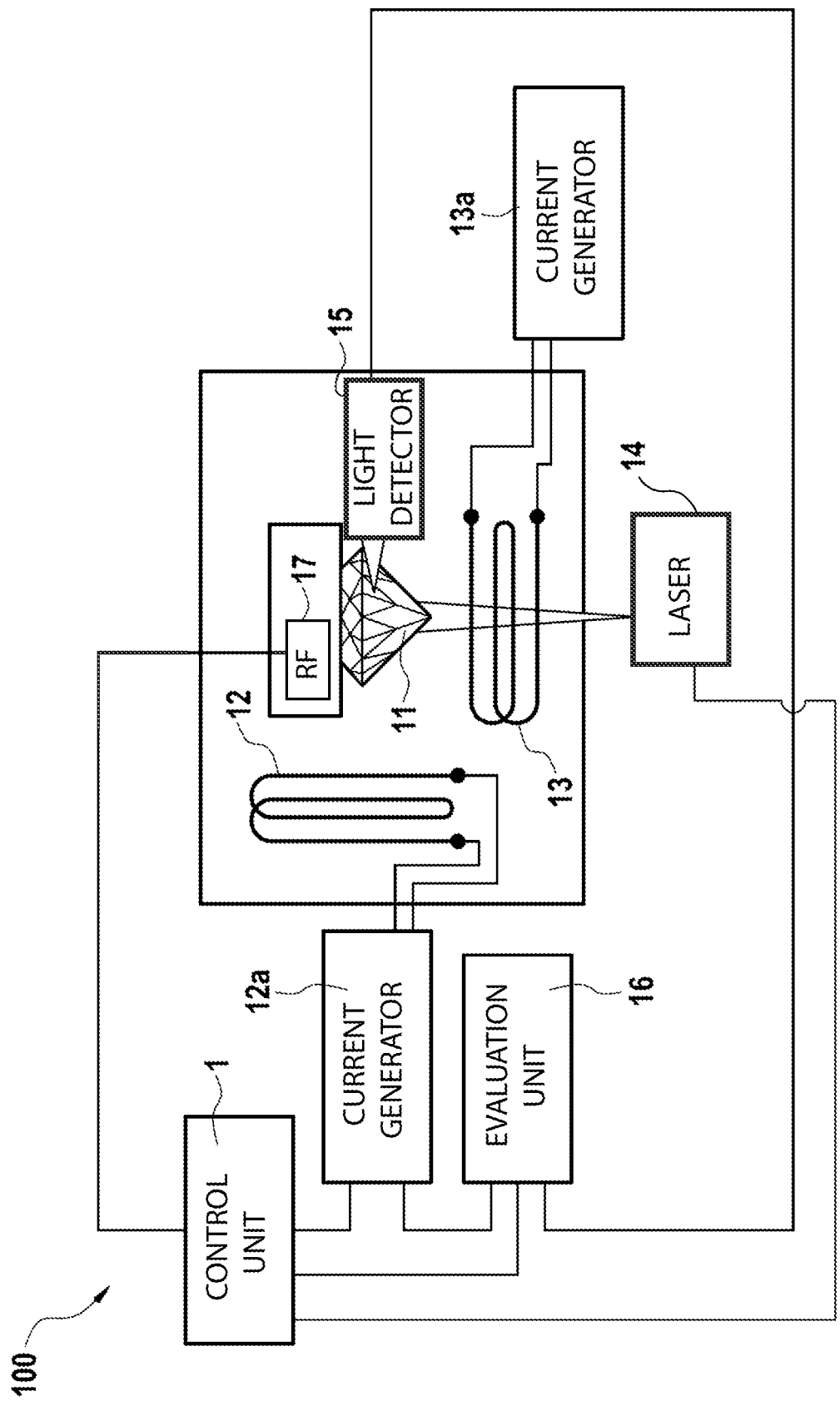
FIG. 5 shows a schematic illustration of a preferred form of embodiment of an NMR gyroscope according to the disclosure.

FIG. 5 shows a form of embodiment of an NMR gyroscope according to the disclosure, identified as 100.

The NMR gyroscope 100 comprises a diamond 11 doped with color centers. The color centers are in particular formed as nitrogen or silicon vacancies. A first magnetic field generator is furthermore provided, comprising a first current generator 13a as well as a first magnetic field coil 13. This magnetic field generator is provided to generate a static magnetic field in a first direction (vertical, in the figure).

A laser 14 and an RF transmitter 17, preceded by a control unit 1, are provided as polarization apparatus for polarizing the nuclear spin of the diamond 11.

A second magnetic field generator for generating an alternating magnetic field in a second direction (horizontal, in the figure) perpendicular to the first direction, comprising a second current generator 12a as well as a second magnetic field coil 12, is furthermore present.

The laser 14 also functions as a source for excitation light, and is configured together with the RF transmitter 17 to excite the color centers to fluorescence.

A light detector 15 is provided to detect an intensity of fluorescent light generated by the microwave pulse and the excitation light.

An evaluation unit 16 is configured to ascertain a change in the orientation in a plane perpendicular to the first direction on the basis of a deviation of the precession frequency ascertained through the detected intensity from an expected value.

What is claimed is:

1. A method for ascertaining a change in a spatial orientation of a nuclear magnetic resonance (NMR) gyroscope having a diamond doped with color centers, the method comprising:
    applying a static external magnetic field in a first direction;
    polarizing a nuclear spin of the color centers of the diamond in a direction of the static external magnetic field;
    generating a cophasal Larmor precession of the nuclear spin of the color centers through application of an alternating magnetic field in a second direction perpendicular to the first direction, the alternating magnetic field having a frequency corresponding to a Larmor frequency of the nuclear spin of the color centers;
    measuring a phase of the Larmor precession; and
    ascertaining a change in the spatial orientation of the diamond in a plane perpendicular to the first direction based on a deviation of the precession frequency from an expected value.

2. The method according to claim 1, further comprising:
    adjusting the alternating magnetic field in the second direction in the presence of the deviation of the precession frequency from the expected value using a phase-locked loop corresponding to a phase shift between the measured precession frequency and the applied magnetic field, so that the alternating magnetic field and the Larmor precession are again cophasal.

3. The method according to claim 2, further comprising:
    ascertaining the change in the spatial orientation from the adjustment of the applied alternating magnetic field based on a relationship $\overline{\omega_k} = \gamma_k \overline{B} + \overline{\Omega}$,
    wherein $\overline{\omega_L}$ is the precession frequency of the nuclear spin,
    wherein $\overline{B}$ is the static external magnetic field in the first direction,
    wherein $\gamma_k$ is a gyromagnetic ratio, and
    wherein $\overline{\Omega}$ is the change in the spatial orientation in the plane perpendicular to the first direction.

4. The method according to claim 1, further comprising:
    screening the NMR gyroscope from external interfering magnetic fields.

5. The method according to claim 1, wherein the polarization of the nuclear spin comprises:
    irradiating the diamond with a laser pulse having a duration and an intensity selected such that all of the color centers lying within an irradiation region are optically excited, so that the color centers enter a ground state with magnetic quantum number ms=0 in which electron spins are polarized, but the nuclear spins have two states, so that hyperfine structure splitting is still maintained;
    irradiating the diamond with a microwave pulse having a frequency selected such that the microwave pulse drives a resonant transition from the ground state with magnetic quantum number ms=0 to a hyperfine level with magnetic quantum number ms=−1 or ms=+1, a length of the microwave pulse corresponding to half a Rabi time constant;
    irradiating the diamond with a radio frequency (RF) π-pulse so that a transition between hyperfine levels with the same electron spin but with different nuclear spin orientation is generated; and
    irradiating the diamond with laser light, so that electron states are optically excited and subsequently fall back to a lowest hyperfine structure level.

6. The method according to claim 1, wherein the measurement of the phase of the Larmor precession comprises:
    irradiating the diamond with a microwave pulse and an excitation light beam to trigger a fluorescence of the color centers, and
    measuring an intensity of the fluorescence.

7. A nuclear magnetic resonance (NMR) gyroscope comprising:
    a diamond doped with color centers;
    a first magnetic field generator configured to generate a static magnetic field in a first direction;
    a polarization apparatus configured to polarize nuclear spins of the diamond in the first direction;
    a second magnetic field generator configured to generate an alternating magnetic field in a second direction perpendicular to the first direction;
    a radio frequency (RF) transmitter configured to irradiate the diamond with a microwave pulse;
    a source of excitation light configured to excite the color centers to fluorescence together with the RF transmitter;
    a light detector configured to detect an intensity of fluorescent light generated in response to the microwave pulse and the excitation light; and
    an evaluation apparatus configured to ascertain a change in a spatial orientation of the diamond in a plane perpendicular to the first direction based on of a deviation of the Larmor precession frequency, ascertained from the detected intensity, from an expected value.

8. The NMR gyroscope according to claim 7, wherein the evaluation apparatus comprises:
    a phase-locked loop configured to adjust the alternating magnetic field in the second direction when a deviation of the precession frequency from the expected value corresponding to a phase shift between the measured precession frequency and the applied alternating magnetic field occurs, so that the alternating magnetic field and the Larmor precession are again cophasal.

9. The NMR gyroscope according to claim 8, wherein:
    the evaluation apparatus is configured to ascertain the change in the spatial orientation from the adjustment of the applied alternating magnetic field based on a relationship $\overline{\omega_L} = \gamma_k \overline{B} + \overline{\Omega}$,
    $\overline{\omega_L}$ is the precession frequency of the nuclear spin,
    $\overline{B}$ is the static external magnetic field in the first direction,
    $\gamma_k$ is a gyromagnetic ratio, and
    $\overline{\Omega}$ is the change in the spatial orientation in the plane perpendicular to the first direction.

10. The NMR gyroscope according to claim 7, wherein the polarization apparatus is configured to:
    drive the source of excitation light to irradiate the diamond by a laser pulse having a duration and an intensity selected such that all of the color centers lying within an irradiation region are optically excited once, so that the color centers enter a ground state with magnetic quantum number ms=0 in which electron spins are polarized, but the nuclear spins have two states, so that hyperfine structure splitting is still maintained;

drive the RF transmitter to irradiate the diamond by a microwave pulse having a frequency selected such that the microwave pulse drives a resonant transition from a state with magnetic quantum number ms=0.1 or ms=+1, a length of the microwave pulse corresponding to half a Rabi time constant;

drive the RF transmitter to irradiate the diamond by an RF π pulse in such a way that a transition between hyperfine levels with a same electron spin but different nuclear spin orientations is generated; and drive the source of excitation light to irradiate the diamond with laser light in such a way that the electron states are optically excited and then fall back to a lowest hyperfine structure level.

* * * * *